(12) United States Patent
Otsuki et al.

(10) Patent No.: US 11,737,276 B2
(45) Date of Patent: Aug. 22, 2023

(54) METHOD OF MANUFACTURING SEMICONDUCTOR DEVICE AND SEMICONDUCTOR DEVICE

(71) Applicant: Tokyo Electron Limited, Tokyo (JP)

(72) Inventors: Sara Otsuki, Yamanashi (JP); Genji Nakamura, Yamanashi (JP); Muneyuki Otani, Iwate (JP); Kazuya Takahashi, Boise, ID (US)

(73) Assignee: Tokyo Electron Limited, Tokyo (JP)

( * ) Notice: Subject to any disclaimer, the term of this patent is extended or adjusted under 35 U.S.C. 154(b) by 175 days.

(21) Appl. No.: 17/331,813

(22) Filed: May 27, 2021

(65) Prior Publication Data
US 2022/0384473 A1 Dec. 1, 2022

(51) Int. Cl.
*H01L 21/02* (2006.01)
*H10B 43/27* (2023.01)
*H10B 41/27* (2023.01)

(52) U.S. Cl.
CPC ....... *H10B 43/27* (2023.02); *H01L 21/02175* (2013.01); *H01L 21/02178* (2013.01); *H01L 21/02181* (2013.01); *H01L 21/02186* (2013.01); *H01L 21/02189* (2013.01); *H01L 21/02194* (2013.01); *H01L 21/02356* (2013.01); *H10B 41/27* (2023.02)

(58) Field of Classification Search
None
See application file for complete search history.

(56) References Cited

U.S. PATENT DOCUMENTS

| 2010/0193782 A1* | 8/2010 | Sakata | H01L 29/7869 257/E21.414 |
| 2010/0221905 A1* | 9/2010 | Hautala | H01L 29/7881 257/E21.21 |
| 2012/0100707 A1* | 4/2012 | Ryu | H10B 41/27 257/E21.209 |

(Continued)

FOREIGN PATENT DOCUMENTS

| JP | 2010-141256 | 6/2010 |
| JP | 2012-146915 | 8/2012 |

(Continued)

*Primary Examiner* — Ali Naraghi
*Assistant Examiner* — Siangluai Mang
(74) *Attorney, Agent, or Firm* — IPUSA, PLLC

(57) ABSTRACT

A method of manufacturing a semiconductor device according to the present disclosure includes forming a stack by alternately stacking insulating films and sacrificial films on a substrate; forming, in the stack, a through-hole extending in a thickness direction of the stack; forming a block insulating film, a charge trapping film, a tunnel insulating film, and a channel film on an inner surface of the through-hole in this order; forming, in the stack, a slit extending in the thickness direction of the stack separately from the through-hole; removing the sacrificial films through the slit so as to form a recess between adjacent insulating films; forming a first metal oxide film on an inner surface of the recess; forming, on the first metal oxide film, a second metal oxide film having a crystallization temperature lower than that of the first metal oxide film; and filling the recess with an electrode layer.

9 Claims, 7 Drawing Sheets

(56) References Cited

U.S. PATENT DOCUMENTS

| | | | | |
|---|---|---|---|---|
| 2012/0126300 A1* | 5/2012 | Park | ......................... | H01G 4/20 |
| | | | | 257/296 |
| 2013/0032873 A1* | 2/2013 | Kiyotoshi | .............. | H10B 43/27 |
| | | | | 257/E21.21 |
| 2014/0080282 A1* | 3/2014 | Chiang | ................... | H01L 28/40 |
| | | | | 257/E21.011 |
| 2016/0379989 A1* | 12/2016 | Sharangpani | ..... | H01L 21/31155 |
| | | | | 438/269 |
| 2017/0125436 A1* | 5/2017 | Sharangpani | ....... | H01L 21/0228 |
| 2019/0088675 A1* | 3/2019 | Itokawa | ................. | H10B 43/27 |
| 2020/0266202 A1* | 8/2020 | Kwon | ................... | H10B 41/35 |

FOREIGN PATENT DOCUMENTS

| | | |
|---|---|---|
| JP | 2018-137388 | 8/2018 |
| JP | 2019-054149 | 4/2019 |

\* cited by examiner

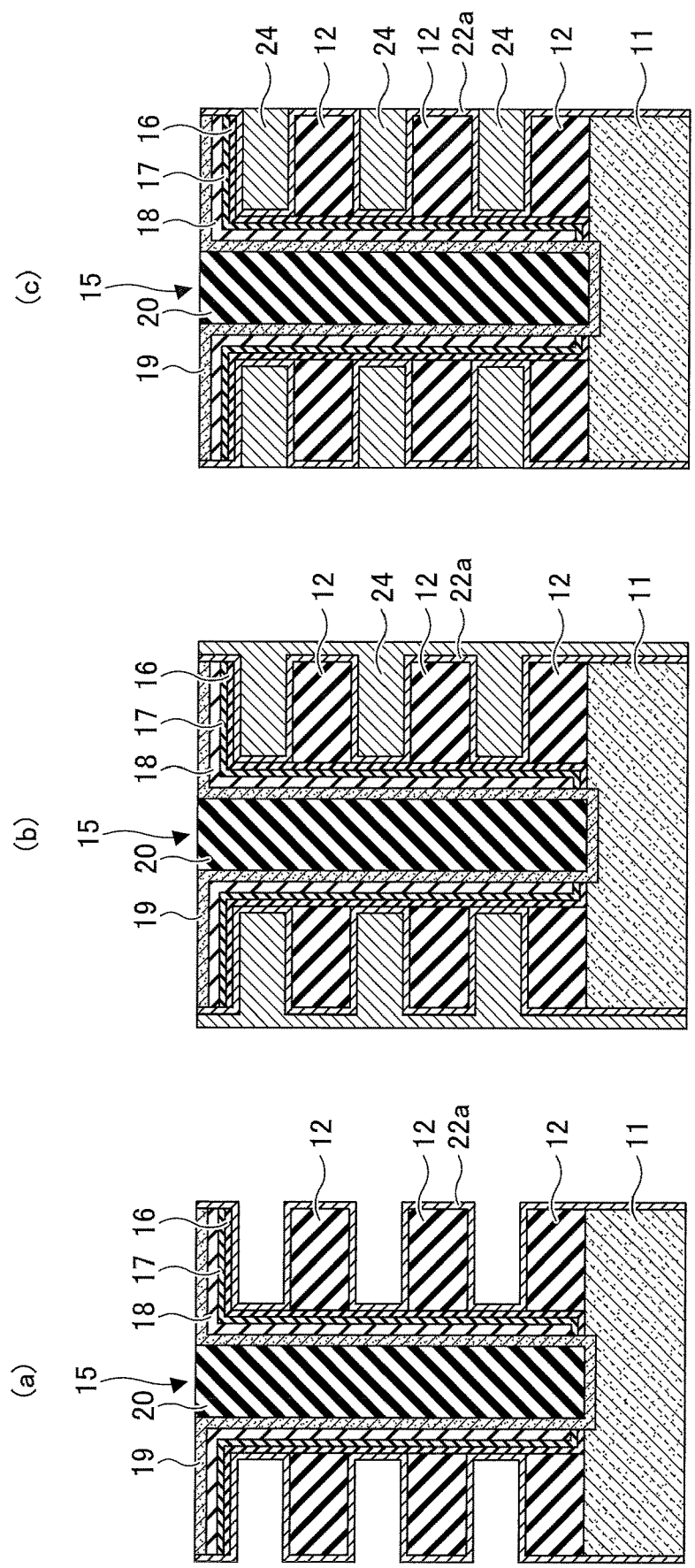

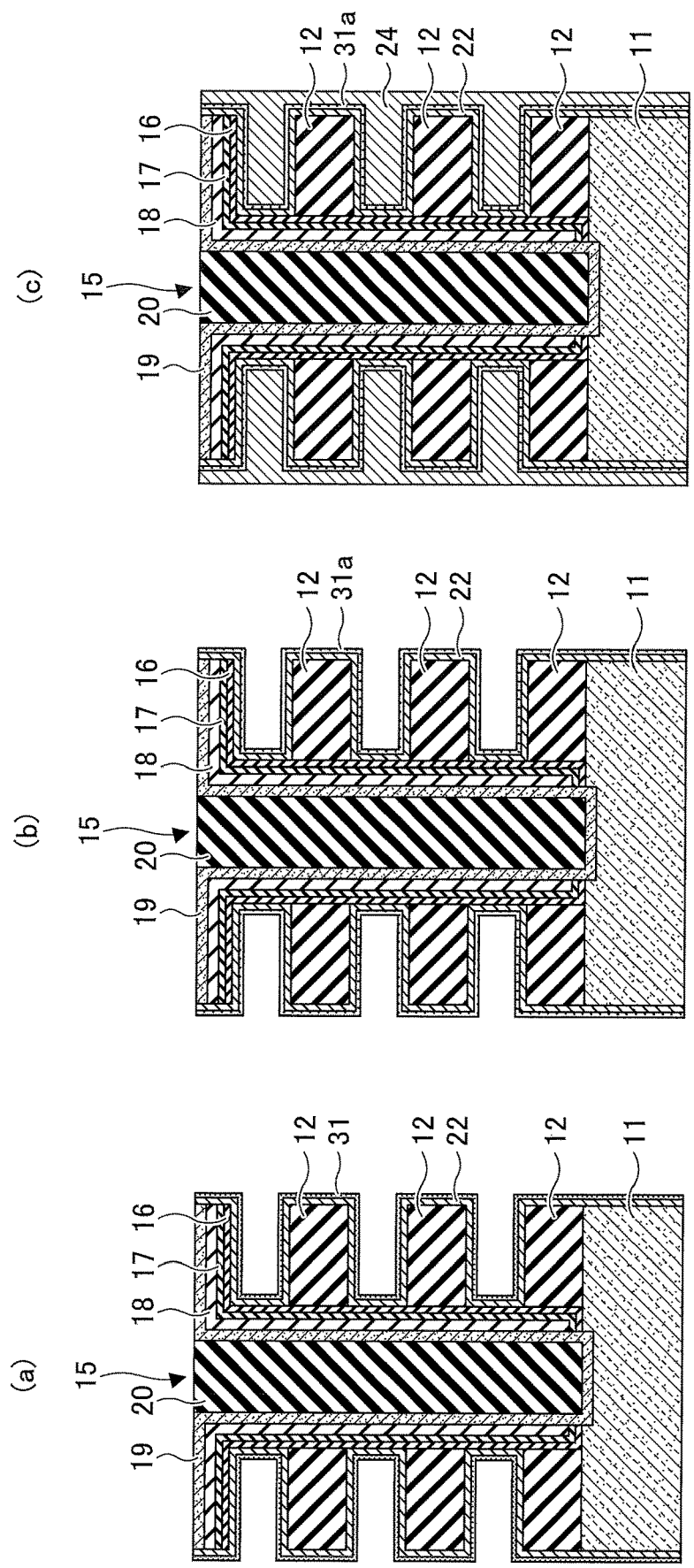

METHOD OF MANUFACTURING SEMICONDUCTOR DEVICE AND SEMICONDUCTOR DEVICE

BACKGROUND OF THE INVENTION

1. Field of the Invention

The present disclosure relates to a method of manufacturing a semiconductor device and a semiconductor device.

2. Background Art

Semiconductor devices having stacked structures are known. In such a semiconductor device, a tunnel oxide layer, a charge trapping layer, a blocking oxide layer, and a gate electrode are formed on a silicon substrate in this order from the bottom side (see Patent Document 1, for example). In a semiconductor device described in Patent Document 1, a blocking oxide layer includes a crystalline layer disposed adjacent to a charge trapping layer and an amorphous layer over the crystalline layer.

The present disclosure provides a technology that can reduce the thickness of a block oxide film and improve etching resistance.

RELATED-ART DOCUMENTS

Patent Documents

Patent Document 1: Japanese Laid-open Patent Publication No. 2010-141256

SUMMARY OF THE INVENTION

According to one aspect of the present disclosure, a method of manufacturing a semiconductor device includes forming a stack by alternately stacking insulating films and sacrificial films on a substrate; forming, in the stack, a through-hole extending in a thickness direction of the stack; forming a block insulating film, a charge trapping film, a tunnel insulating film, and a channel film on an inner surface of the through-hole in this order; forming, in the stack, a slit extending in the thickness direction of the stack separately from the through-hole; removing the sacrificial films through the slit so as to form a recess between adjacent insulating films; forming a first metal oxide film on an inner surface of the recess; forming, on the first metal oxide film, a second metal oxide film having a crystallization temperature lower than a crystallization temperature of the first metal oxide film; and filling the recess with an electrode layer.

According to the present disclosure, the thickness of a block oxide film can be reduced and etching resistance can be improved.

BRIEF DESCRIPTION OF THE DRAWINGS

FIG. 4 is a schematic cross-sectional view illustrating an example of the method of manufacturing the semiconductor device according to the first embodiment;

FIG. 7 is a schematic cross-sectional view illustrating an example of a method of manufacturing a semiconductor device according to a second embodiment.

DESCRIPTION OF THE EMBODIMENTS

Figure 1:
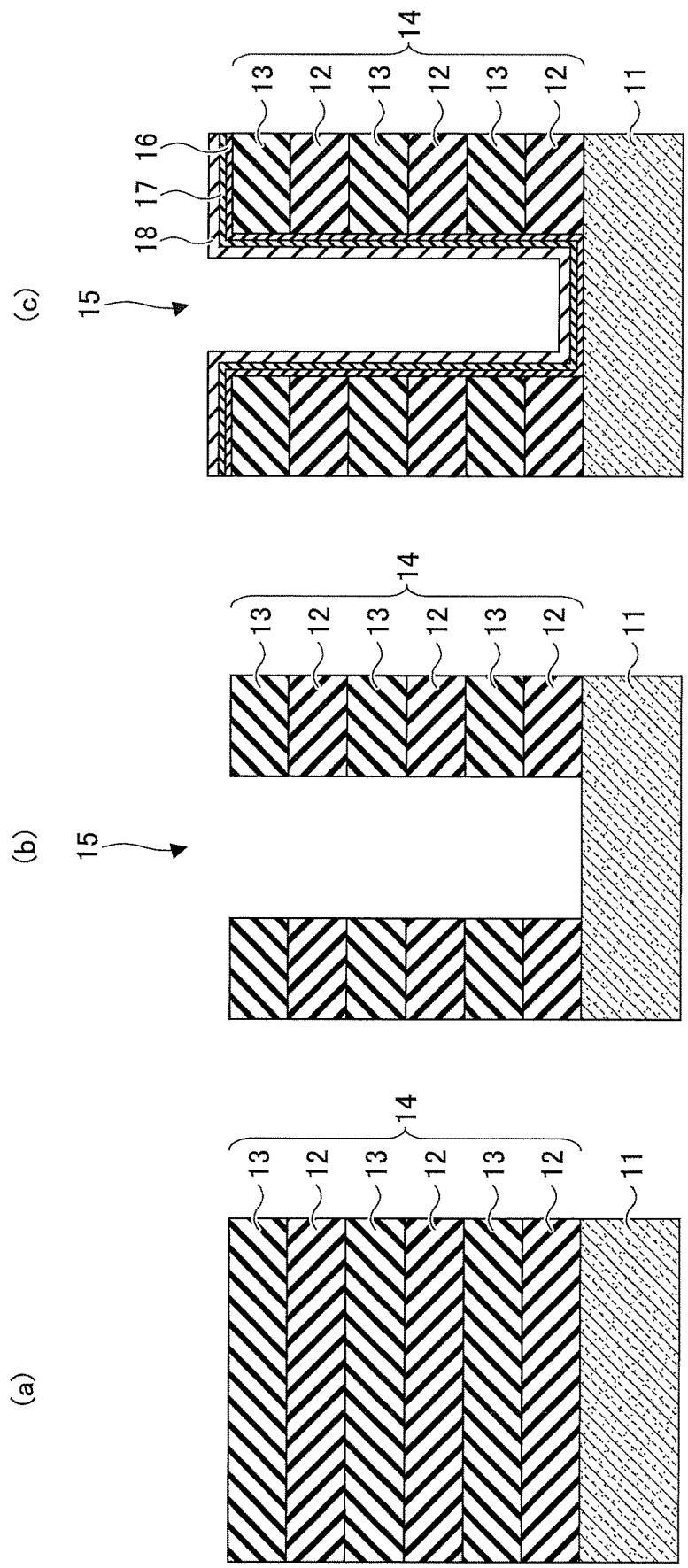
FIG. 1 is a schematic cross-sectional view illustrating an example of a method of manufacturing a semiconductor device according to a first embodiment.

In the following, non-limiting exemplary embodiments of the present disclosure will be described with reference to the accompanying drawings. In the accompanying drawings, the same or corresponding members or components are denoted by the same or corresponding reference numerals, and the description thereof will not be repeated.

[Three-Dimensional NAND Memory]

In a three-dimensional NAND memory, for example, aluminum oxide (AlO) may be used as a block oxide film and tungsten may be used as a control gate (word line). After the block oxide film is formed, the block oxide film is crystallized by heat treatment so as to have high etching resistance to an etchant such as PAN (a mixed solution of $H_3PO_4$, $HNO_3$, and $CH_3COOH$) used in a subsequent process.

In such a three-dimensional NAND memory, if the thickness of a control gate is reduced along with the size reduction, the resistance of the control gate may be increased, and as a result, the operating speed may be reduced and power consumption may be increased. Therefore, in order to improve the operating speed and reduce power consumption, it has been studied to decrease the resistance of the control gate by reducing the thickness of the block oxide film and increasing the thickness of the control gate instead.

However, if the thickness of the block oxide film is reduced, the heat treatment temperature for crystallization of the block oxide film may be increased. If the thickness of the block oxide film is further reduced, the block oxide film would not be crystallized. Further, if the heat treatment temperature is increased, films constituting a three-dimensional NAND memory, such as a block insulating film, a charge trapping film, and a tunnel insulating film, may be affected by heat, thereby causing memory characteristics to be degraded.

In the following, a method of manufacturing a semiconductor device that can reduce the thickness of a block oxide film and improve etching resistance will be described.

First Embodiment

An example of a method of manufacturing a semiconductor device according to a first embodiment will be described with reference to FIG. 1 through FIG. 6. In the following, a method of manufacturing a three-dimensional NAND memory as a semiconductor device will be described.

First, as illustrated in FIG. 1 (*a*), a stack 14 is formed by alternately stacking insulating films 12 and sacrificial films 13 on a substrate 11 by using, for example, an atomic layer deposition (ALD) method or a chemical vapor deposition (CVD) method. The substrate 11 is, for example, a semiconductor substrate such as a monocrystalline silicon substrate. The insulating films 12 may be formed of, for example, silicon oxide. The sacrificial films 13 may be formed of, for example, silicon nitride.

Next, as illustrated in FIG. 1 (b), a memory hole 15 is formed in the stack 14 by, for example, a reactive-ion etching (RIE) method. The memory hole 15 passes through the stack 14 and reaches the substrate 11.

Next, as illustrated in FIG. 1 (c), a block insulating film 16, a charge trapping film 17, and a tunnel insulating film 18 are formed on the inner surface of the memory hole 15 in this order by, for example, the ALD method or the CVD method. The block insulating film 16 may be formed of, for example, silicon oxide. The charge trapping film 17 may be formed of, for example, silicon nitride. The charge trapping film 17 has a trap site for trapping charges. The tunnel insulating film 18 may be formed of, for example, silicon oxide.

Figure 2:
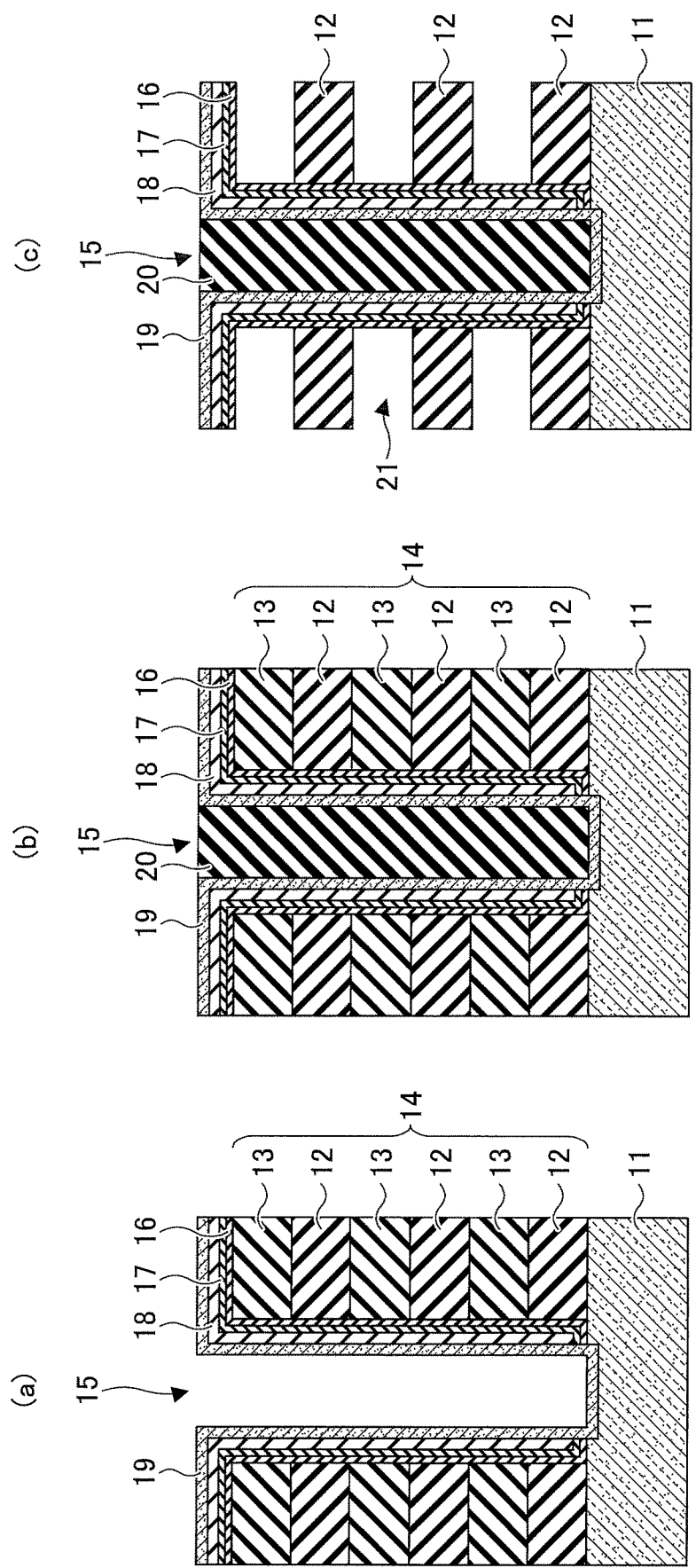
FIG. 2 is a schematic cross-sectional view illustrating an example of the method of manufacturing the semiconductor device according to the first embodiment.

Next, as illustrated in FIG. 2 (a), a channel film 19 is formed on the tunnel insulating film 18 in the memory hole 15 by for example, the ALD method or the CVD method. The channel film 19 may be formed of, for example, non-crystalline (amorphous) silicon. Next, the channel film 19, the tunnel insulating film 18, the charge trapping film 17, and the block insulating film 16 located on the bottom surface of the memory hole 15 are removed, and a part of the substrate 11 exposed by the removal is also removed. Next, the channel film 19 is formed again on the substrate 11 and on the tunnel insulating film 18, the charge trapping film 17, and the block insulating film 16 in the memory hole 15. Next, the channel film 19 is crystallized by, for example, annealing.

Next, as illustrated in FIG. 2 (b), a core film 20 is formed on the channel film 19 in the memory hole 15 by, for example, the ALD method or the CVD method, so as to fill the memory hole 15 with the core film 20. The core film 20 may be formed of, for example, silicon oxide.

Next, as illustrated in FIG. 2 (c), separately from the memory hole 15, a slit (not illustrated) extending in the thickness direction of the stack 14 is formed by, for example, the RIE method. Next, the sacrificial films 13 of the stack 14 are selectively removed through the slit by wet etching. As a result, recesses 21 are formed between adjacent insulating films 12.

Figure 3:
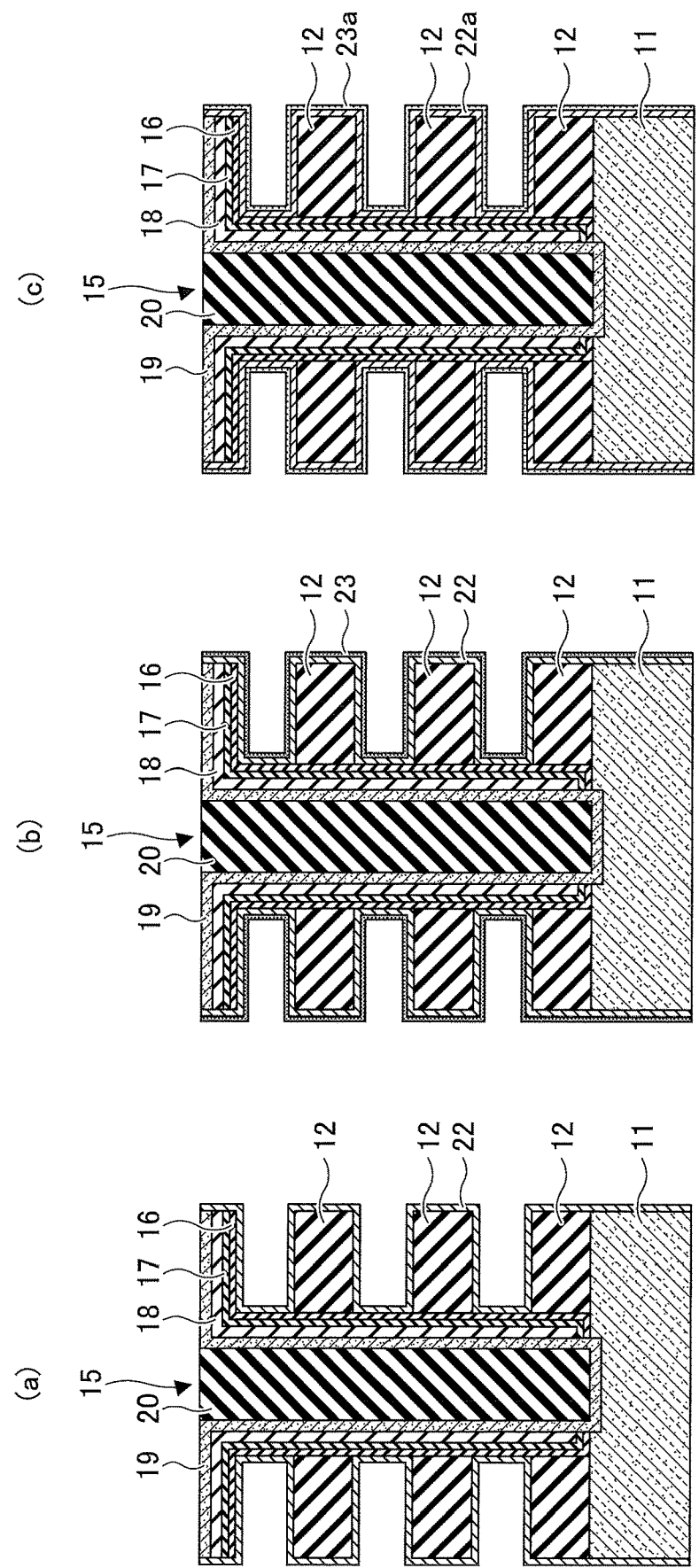
FIG. 3 is a schematic cross-sectional view illustrating an example of the method of manufacturing the semiconductor device according to the first embodiment.

Next, as illustrated in FIG. 3 (a), a block oxide film 22 is formed on the inner surfaces of the recesses 21 by, for example, the ALD method or the CVD method. The block oxide film 22 may be formed of, for example, aluminum oxide (AlO). The thickness of the block oxide film 22 may be, for example, 2 nm to 3 nm. When the block oxide film 22 is formed, an inorganic raw material such as $AlCl_3$ is preferably used. Accordingly, the block oxide film 22 can be uniformly formed on the inner surfaces of the narrow and deep recesses 21 arranged in a fishbone pattern. The block oxide film 22 is amorphous immediately after the block oxide film 22 is formed on the inner surfaces of the recesses 21.

Next, as illustrated in FIG. 3 (b), a template film 23 is formed on the block oxide film 22 in the recesses 21 by, for example, the ALD method or the CVD method. The template film 23 is a film having a crystallization temperature lower than that of the block oxide film 22, and having an etching selectivity with respect to the material of the block oxide film 22. For example, if the block oxide film 22 is formed of AlO, the template film 23 is formed of ZrO, MgO, TiO, NiO, or $SrTiO_3$, or a combination thereof. The thickness of the template film 23 may be, for example, 0.5 nm to 1.0 nm. The template film 23 is preferably formed of MgO, TiO, or $SrTiO_3$, or a combination thereof. Accordingly, the degree of lattice mismatch with AlO forming the block oxide film 22 is decreased, and thus, the template film 23 can be formed without distortion or the like. Further, the template film 23 is more preferably formed of $SrTiO_3$. This is because $SrTiO_3$ is crystallized by heat treatment at approximately 600° C., and has a lattice constant closer to AlO forming the block oxide film 22 (the degree of lattice mismatch is approximately 1.3%).

Next, as illustrated in FIG. 3 (c), the substrate 11 is subjected to heat treatment so as to crystallize the block oxide film 22. A crystalline block oxide film 22a has high etching resistance to an etchant used to etch an electrode layer 24, which will be described later. At this time, because the template film 23, having a crystallization temperature lower than that of the block oxide film 22, is formed on the block oxide film 22, both the template film 23 and the block oxide film 22 are crystallized by heating the substrate 11 at a temperature higher than the crystallization temperature of the template film 23. Therefore, the block oxide film 22 can be crystallized at a temperature lower than that when the template film 23 is not formed on the block oxide film 22. In other words, because the template film 23 is formed on the block oxide film 22, the crystallization temperature of the block oxide film 22 can be reduced. Accordingly, the block insulating film 16, the charge trapping film 17, and the tunnel insulating film 18 will not be affected by heat when the block oxide film 22 is crystallized, thereby suppressing degradation of memory characteristics. For example, if the film thickness is 2.5 nm, the crystallization temperature of AlO is 950° C., the crystallization temperature of ZrO is 500° C., the crystallization temperature of TiO is less than 400° C., and the crystallization temperature of $SrTiO_3$ is 600° C. Therefore, if the block oxide film 22 is formed of AlO and the template film 23 is formed of any one of ZrO, TiO, and $SrTiO_3$, AlO forming the block oxide film 22 can be crystallized by heat treatment at a temperature less than 800° C.

Figure 6:
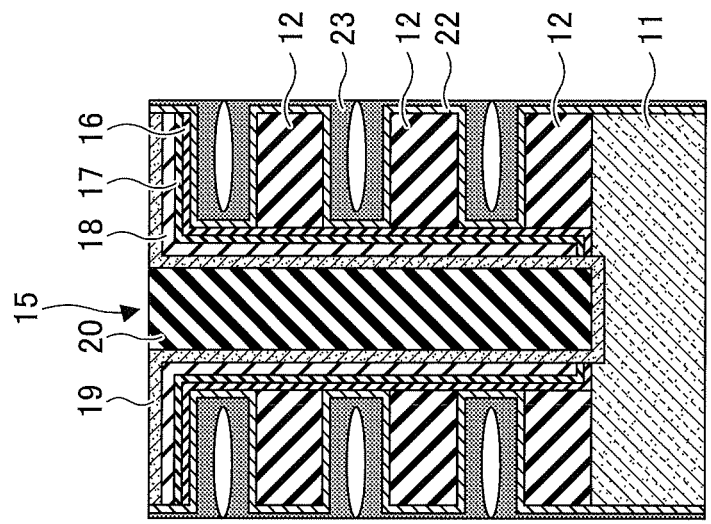
FIG. 6 is a schematic cross-sectional view illustrating an example of the method of manufacturing the semiconductor device according to the first embodiment.

Next, as illustrated in FIG. 4 (a), a crystalline template film 23a is removed by, for example, wet cleaning. As a result, only the crystalline block oxide film 22a with a small thickness remains on the inner surfaces of the recesses 21. As a cleaning solution for wet cleaning, a hydrochloric hydrogen peroxide mixture (HPM: a mixed solution of HCl, $H_2O_2$, and $H_2O$) or the like can be used. Note that when the template film 23 is formed on the block oxide film 22 that is formed on the inner surfaces of the recesses 21 arranged in a fishbone pattern, there may be a case where the template film 23 is not conformally formed in the recesses 21, as illustrated in FIG. 6. However, the template film 23 is removed after the block oxide film 22 is crystallized. Therefore, even if the template film 23 is not conformally formed, only the crystalline block oxide film 22a with a small thickness can remain on the inner surfaces of the recesses 21.

Next, as illustrated in FIG. 4 (b), an electrode layer 24 is formed on the block oxide film 22 within the recesses 21 by, for example, the ALD method or the CVD method. At this time, because the crystalline block oxide film 22a having a small thickness is formed on the inner surfaces of the recesses 21, the thickness of the electrode layer 24 formed in the recesses 21 can be increased. As a result, the resistance of the electrode layer 24 can be decreased, thereby allowing the operating speed of the memory to be improved. Note that the electrode layer 24 may be formed outside the recesses 21. The electrode layer 24 may be formed of, for example, a stack of titanium nitride and tungsten.

Next, as illustrated in FIG. 4 (c), portions of the electrode layer 24 formed outside the recesses 21 are removed by, for example, wet etching. As an etchant for wet etching, PAN (a mixed solution of $H_3PO_4$, $HNO_3$, and $CH_3COOH$) can be used. At this time, the insulating films 12 are covered by the crystalline block oxide film 22a, and the crystalline block oxide film 22a has high etching resistance to the etchant. Therefore, the insulating films 12 are prevented from being etched by the etchant.

Figure 5:
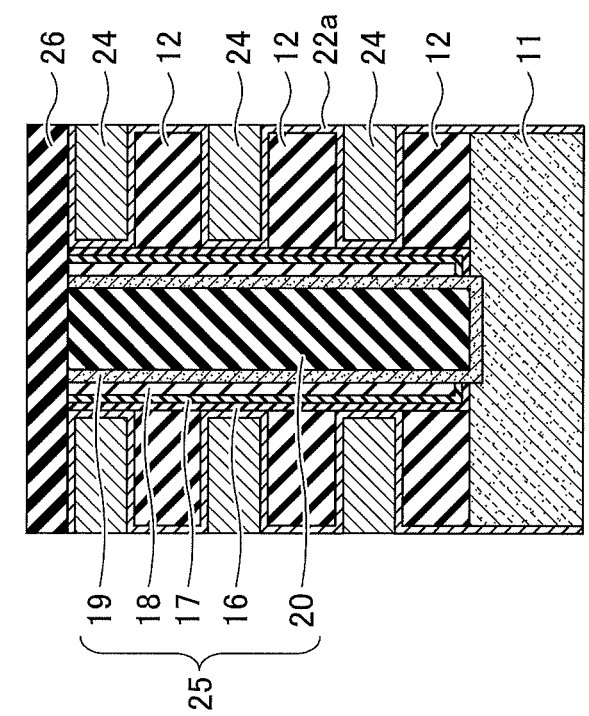
FIG. 5 is a schematic cross-sectional view illustrating an example of the method of manufacturing the semiconductor device according to the first embodiment.

Next, as illustrated in FIG. 5, the block insulating film 16, the charge trapping film 17, the tunnel insulating film 18, the channel film 19, and the core film 20 located on the upper surface of the stack 14 are removed by, for example, the RIE method or a chemical mechanical polishing (CMP) method, and the upper surface of the stack 14 is flattened. As a result, a columnar portion 25 including the core film 20, the channel film 19, the tunnel insulating film 18, the charge trapping film 17, and the block insulating film 16 is formed. Next, an insulating layer 26 is formed on the upper surface of the stack 14 by, for example, the CVD method. The insulating layer 26 may be formed of, for example, silicon oxide. Next, contacts and bit lines connected to the channel film 19 are formed. In this manner, the three-dimensional NAND memory is manufactured.

As described above, according to the first embodiment, after the template film 23 having a crystallization temperature lower than that of the block oxide film 22 is formed on the block oxide film 22, the substrate 11 is subjected to heat treatment so as to crystallize the block oxide film 22. Then, the template film 23 is removed. In this manner, because the template film 23 is formed on the block oxide film 22, the crystallization temperature of the block oxide film 22 can be reduced, and thus, the thickness of the block oxide film 22 can be reduced. In addition, because the block oxide film 22 is crystallized, the etching resistance to the etchant used to etch the electrode layer 24 can be improved.

Second Embodiment

An example of a method of manufacturing a semiconductor device according to a second embodiment will be described with reference to FIG. 7 and FIG. 8. The method of manufacturing the semiconductor device according to the second embodiment differs from the method of manufacturing the semiconductor device according to the first embodiment, in that a capping film 31 is formed on a block oxide film 22, the capping film 31 is crystallized, and an electrode layer 24 is formed on a crystalline capping film 31a. In the following, differences from the method of manufacturing the semiconductor device according to the first embodiment will be mainly described.

First, a manufacturing process is performed until a block oxide film 22 is formed on the inner surfaces of recesses 21 in the same manner as described with reference to FIG. 1 (a) through FIG. 1 (c), FIG. 2 (a) through FIG. 2 (c), and FIG. 3 (a). In the second embodiment, the thickness of the block oxide film 22 is 1.5 nm.

Next, as illustrated in FIG. 7 (a), a capping film 31 is formed on the block oxide film 22 in the recesses 21 by, for example, the ALD method or the CVD method. The capping film 31 is a film having a crystallization temperature lower than that of the block oxide film 22. For example, if the block oxide film 22 is formed of AlO, the capping film 31 is formed of ZrO or HfO, or a combination thereof. The capping film 31 may be formed of HfSiO in which Si is added to HfO. The thickness of the capping film 31 may be, for example, 0.5 nm to 1.5 nm. The capping film 31 is formed, for example, by alternately supplying a metallic material and an oxidizing agent (such as $O_3$) to the substrate 11, and repeatedly adsorbing the metallic material on the substrate 11 and oxidizing the adsorbed metallic material. In this manner, the capping film 31 is conformally formed on the block oxide film 22 in the recesses 21. Examples of the metallic material include tetrakis(ethylmethylamino)zirconium (TEMAZ), tris(dimethylamino)cyclopentadienyl zirconium $((C_5H_5)Zr[N(CH_3)_2]_3)$, tetrakis(dimethylamino)hafnium (TDMAH), and tris(dimethylamino)cyclopentadienyl hafnium $(HfCp(NMe_2)_3)$.

Next, as illustrated in FIG. 7(b), the substrate 11 is subjected to heat treatment so as to crystallize the capping film 31. A crystalline capping film 31a has high etching resistance to an etchant used to etch an electrode layer 24, which will be described later. At this time, the capping film 31 having a crystallization temperature lower than that of the block oxide film 22 is formed on the block oxide film 22, and the capping film 31 is not removed in a process described below. Because the block oxide film 22 does not need to be crystallized, the heat treatment temperature may be greater than or equal to the crystallization temperature of the capping film 31. Further, even when ZrO, HfO, and HfSiO are amorphous, ZrO, HfO, and HfSiO have etching resistance to the etchant used to etch the electrode layer 24, which will be described later. Therefore, the heat treatment temperature may be lower than the crystallization temperature of the capping film 31, or heat treatment does not need to be carried out. However, when ZrO, HfO, and HfSiO are crystallized, the etching resistance to the etchant used to etch the electrode layer 24 is particularly enhanced. Thus, the heat treatment is preferably carried out at a temperature greater than or equal to the crystallization temperature of the capping film 31. In this manner, because the capping film 31 is formed on the block oxide film 22, the heat treatment temperature can be reduced. Accordingly, the block insulating film 16, the charge trapping film 17, and the tunnel insulating film 18 will not be affected by heat, thereby suppressing degradation of memory characteristics.

Next, as illustrated in FIG. 7(c), the electrode layer 24 is formed on the capping film 31 in the recesses 21 by, for example, the ALD method or the CVD method. At this time, because the block oxide film 22 and a crystalline capping film 31a each having a small thickness are formed on the inner surfaces of the recesses 21, the thickness of the electrode layer 24 formed in the recesses 21 can be increased. As a result, the resistance of the electrode layer 24 can be decreased, thereby allowing the operating speed of the memory to be improved. Note that the electrode layer 24 may be formed outside the recesses 21. The electrode layer 24 may be formed of, for example, a stack of titanium nitride and tungsten.

Figure 8:
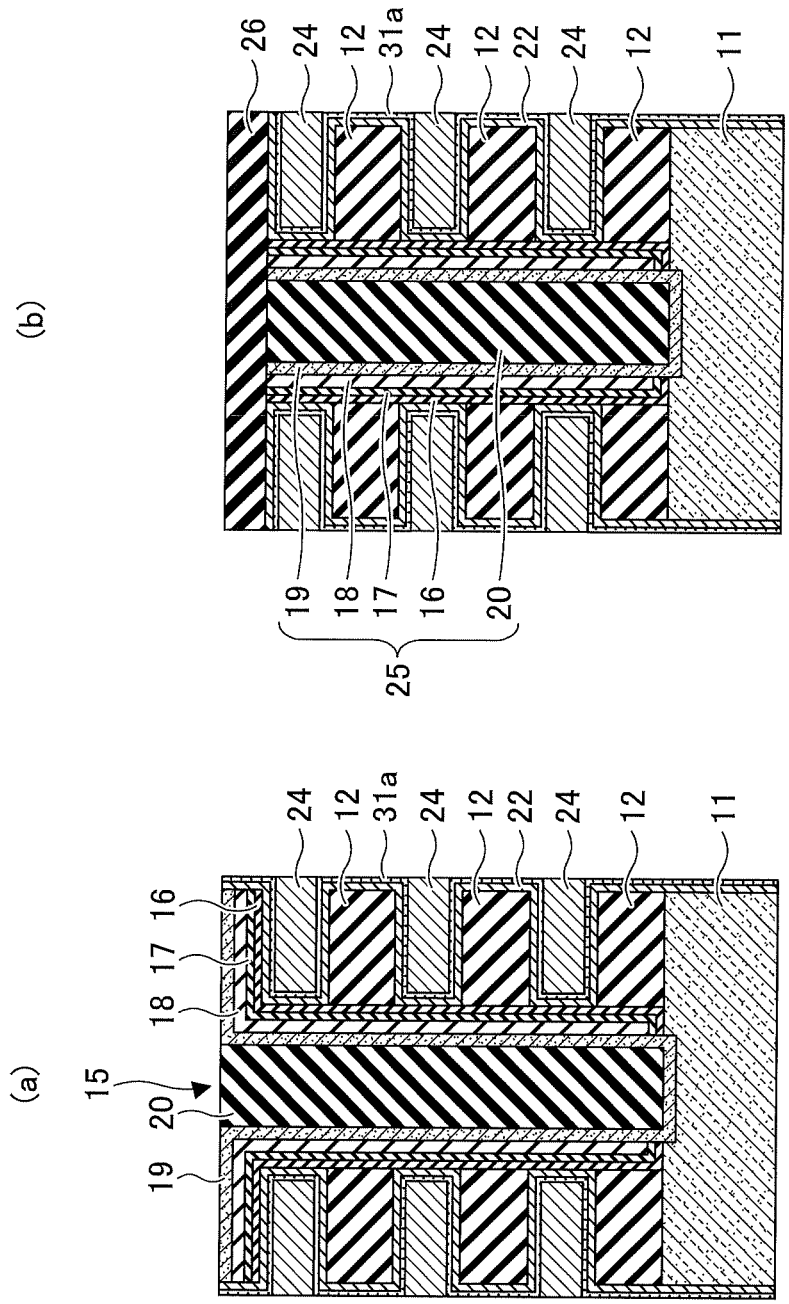
FIG. 8 is a schematic cross-sectional view illustrating an example of the method of manufacturing the semiconductor device according to the second embodiment.

Next, as illustrated in FIG. 8 (a), portions of the electrode layer 24 formed outside the recesses 21 are removed by, for example, wet etching. As an etchant for wet etching, PAN (a mixed solution of $H_3PO_4$, $HNO_3$, and $CH_3COOH$) can be used. At this time, the insulating films 12 and the block oxide film 22 are covered by the crystalline capping film 31a, and the crystalline capping film 31a has high etching resistance to the etchant. Therefore, the insulating films 12 and the block oxide film 22 are prevented from being etched by the etchant.

Next, as illustrated in FIG. 8 (b), the block insulating film 16, the charge trapping film 17, the tunnel insulating film 18, the channel film 19, and the core film 20 located on the upper surface of the stack 14 are removed by, for example, the RIE method or the CMP method, and the upper surface of the stack 14 is flattened. As a result, a columnar portion 25 including the core film 20, the channel film 19, the tunnel insulating film 18, the charge trapping film 17, and the block insulating film 16 is formed. Next, an insulating layer 26 is formed on the upper surface of the stack 14 by, for example, the CVD method. The insulating layer 26 may be formed of, for example, silicon oxide. Next, contacts and bit lines connected to the channel film 19 are formed. In this manner, the three-dimensional NAND memory is manufactured.

As described above, according to the second embodiment, after the capping film 31 having a crystallization temperature lower than that of the block oxide film 22 is formed on the block oxide film 22, the substrate 11 is subjected to heat treatment so as to crystallize the capping film 31. The crystalline capping film 31a is not removed in a subsequent process, and the electrode layer 24 is formed on the crystalline capping film 31a. The crystalline capping film 31a functions as an etch stop for the etchant used to etch the electrode layer 24, and thus, the block oxide film 22 does not need to be crystallized. Accordingly, the thickness of the lock oxide film 22 can be reduced. In addition, because the crystalline capping film 31a has high etching resistance to the etchant used to etch the electrode layer 24, the etching resistance to the etchant can be improved.

Further, it is known that non-crystalline AlO (amorphous AlO) exhibits better erasing characteristics than crystalline AlO. Therefore, according to the second embodiment in which the block oxide film 22 can be formed of amorphous AlO, erasing characteristics can be improved.

In the above-described embodiments, the memory hole 15 is an example of a through-hole, the block oxide film 22 is an example of a first metal oxide, and each of the template film 23 and the capping film 31 is an example of a second metal oxide film.

It should be understood that the embodiments disclosed herein are illustrative in all respects, and are not intended to be restrictive in any way. Various omissions, substitutions, and modifications may be made to the above-described embodiments without departing from the scope of the present invention recited in the claims.

DESCRIPTION OF THE REFERENCE NUMERALS 11 substrate
12 insulating film
13 sacrificial film
14 stack
15 memory hole
16 block insulating film
17 charge trapping film
18 tunnel insulating film
19 channel film
21 recess
22 block oxide film
23 template film
24 electrode layer
31 capping film

The invention claimed is:

1. A method of manufacturing a semiconductor device comprising:
   forming a stack by alternately stacking insulating films and sacrificial films on a substrate;
   forming a through-hole in the stack, the through-hole extending in a thickness direction of the stack;
   forming a block insulating film, a charge trapping film, a tunnel insulating film, and a channel film on an inner surface of the through-hole in this order;
   forming a slit in the stack separately from the through-hole, the slit extending in the thickness direction of the stack;
   removing the sacrificial films through the slit so as to form a recess between adjacent insulating films;
   forming a first metal oxide film on an inner surface of the recess;
   forming a second metal oxide film on the first metal oxide film, the second metal oxide film having a crystallization temperature lower than a crystallization temperature of the first metal oxide film; and
   filling the recess with an electrode layer,
   wherein the forming of the first metal oxide film is performed after the forming of the recess.

2. A method of manufacturing a semiconductor device, comprising:
   forming a stack by alternately stacking insulating films and sacrificial films on a substrate;
   forming a through-hole in the stack, the through-hole extending in a thickness direction of the stack;
   forming a block insulating film, a charge trapping film, a tunnel insulating film, and a channel film on an inner surface of the through-hole in this order;
   forming a slit in the stack separately from the through-hole, the slit extending in the thickness direction of the stack;
   removing the sacrificial films through the slit so as to form a recess between adjacent insulating films;
   forming a first metal oxide film on an inner surface of the recess;
   forming a second metal oxide film on the first metal oxide film, the second metal oxide film having a crystallization temperature lower than a crystallization temperature of the first metal oxide film;
   filling the recess with an electrode layer;
   subjecting the substrate to heat treatment so as to crystallize the first metal oxide film after the second metal oxide film is formed; and
   removing the second metal oxide film after the first metal oxide film is crystallized.

3. The method of manufacturing a semiconductor device according to claim 2, wherein the first metal oxide film includes AlO, and the second metal oxide film includes ZrO, MgO, TiO, NiO, or $SrTiO_3$, or a combination thereof.

4. The method of manufacturing a semiconductor device according to claim 1, comprising,
   subjecting the substrate to heat treatment so as to crystallize the second metal oxide film after the second metal oxide film is formed.

5. The method of manufacturing a semiconductor device according to claim 4, wherein a temperature at which the substrate is subjected to the heat treatment is higher than the crystallization temperature of the second metal oxide film and lower than the crystallization temperature of the first metal oxide film.

6. The method of manufacturing a semiconductor device according to claim 4, wherein the first metal oxide film includes AlO, and the second metal oxide film includes ZrO or HfO, or a combination thereof.

7. The method of manufacturing a semiconductor device according to claim 6, wherein Si is added to the ZrO and/or the HfO.

8. The method of manufacturing a semiconductor device according to claim 4, wherein the forming the second metal oxide film includes
- supplying a metallic material, and
- supplying an oxidizing agent for oxidizing the metallic material.

9. A semiconductor device comprising,
- a channel film provided in a stack and extending in a thickness direction of the stack, the stack including an insulating film and an electrode layer that are alternately stacked; and
- a tunnel insulating film, a charge trapping film, a block insulating film, a first metal oxide film, and a second metal oxide film provided between the electrode layer and the channel film in this order from a channel film side,
- wherein the second metal oxide film is formed of a material having a crystallization temperature lower than a crystallization temperature of the first metal oxide film,
- wherein the first metal oxide film and the second metal oxide film are provided between the insulating film and the electrode layer, the first metal oxide film being in contact with the insulating film, and the second metal oxide film being in contact with the electrode layer.

* * * * *